United States Patent [19]

Gaudreau et al.

[11] Patent Number: 4,866,346
[45] Date of Patent: Sep. 12, 1989

[54] MICROWAVE PLASMA GENERATOR

[75] Inventors: Marcel P. J. Gaudreau, Lexington; Donald K. Smith, Arlington, both of Mass.

[73] Assignee: Applied Science & Technology, Inc., Woburn, Mass.

[21] Appl. No.: 65,281

[22] Filed: Jun. 22, 1987

[51] Int. Cl.$^4$ ............................................... H01J 7/24
[52] U.S. Cl. .................................. 315/111.21; 315/39; 156/643
[58] Field of Search ............... 315/39, 111.21, 111.41, 315/111.71; 204/298; 156/643

[56] References Cited

U.S. PATENT DOCUMENTS

| | | | |
|---|---|---|---|
| 4,430,138 | 2/1984 | Suzuki et al. | 204/192.32 |
| 4,507,588 | 3/1985 | Asmussen et al. | 315/111.41 |
| 4,512,868 | 4/1985 | Fujimura et al. | 204/192.32 |
| 4,543,465 | 9/1985 | Sakudo et al. | 315/111.41 |
| 4,560,952 | 12/1985 | Tegel et al. | 331/96 |

Primary Examiner—Robert L. Griffin
Assistant Examiner—Theodore C. Salindong
Attorney, Agent, or Firm—Joseph S. Iandiorio; Brian M. Dingman

[57] ABSTRACT

A microwave plasma generator for producing an axisymmetric plasma, having a waveguide apparatus, means for introducing a microwave source into the waveguide apparatus, and means for generating a circular axisymmetric microwave field from the microwave source. There are means for tuning the field to match the impedance of a plasma load. Further included is a vacuum chamber for containing a gas to be ionized to form the plasma, means for introducing this gas into the vacuum chamber, and means for coupling the microwave field to the vacuum chamber to form the plasma.

47 Claims, 9 Drawing Sheets

MICROWAVE PLASMA GENERATOR

FIELD OF INVENTION

This invention relates to a microwave plasma generator and more particularly to a device which produces an axisymmetric microwave field for uniform plasma production for uniformly etching and/or doping a substrate and/or depositing a layer of material on a substrate.

BACKGROUND OF INVENTION

Typically, direct current and radio frequency discharges have been used for substrate plasma processing. More recently, plasmas for substrate processing have been produced by introducing a microwave field into a vacuum chamber containing a gas to be ionized. In conventional techniques for microwave plasma generation, the microwave field used to ionize the gas is typically not axisymmetric or tunable. However, for uniform and controllable substrate processing, it is desirable to produce a symmetric plasma from a microwave field which is axisymmetric and which can be tuned to match the impedance of the plasma load.

Presently, uniform substrate processing is typically controlled by putting the substrate on a moving turntable and shaping the microwave discharge tube to form a plasma of only a segment of the circular cross section of the microwave guide. See, for example, U.S. Pat. No. 4,430,138. By controlling the shape of this plasma, a non-axisymmetric microwave discharge can be used to process a substrate somewhat uniformly.

However, this technique exhibits a number of disadvantages, such as the fact that the microwave discharge is not truly axisymmetric and thus does not create a truly uniform plasma, and a turntable must be used to get somewhat uniform substrate processing. In addition, because these microwave plasma production devices are generally not tunable, they cannot be used for plasma production with different substrates and/or different gases at a variety of pressures. Therefore, these traditional microwave plasma production techniques have very limited fixed ranges in which they are useful.

SUMMARY OF INVENTION

It is therefore an object of this invention to provide a microwave plasma generator which produces an axisymmetric microwave field and plasma.

It is a further object of this invention to provide a microwave plasma generator which is tunable to match the impedance of varied plasma loads.

It is a further object of this invention to provide a microwave plasma generator which produces an axisymmetric microwave field with no angular dependence and an integral number of radial mode nodes.

It is a further object of this invention to provide a microwave plasma generator which is useful at many microwave frequencies.

This invention results from the realization that truly effective uniform microwave plasma generation, which is useful with a variety of plasma gases at a variety of pressures, is possible with a waveguide apparatus which is tunable to match the resistive and reactive impedance of the plasma load and which couples an axisymmetric microwave field to a round waveguide for uniform plasma production.

This invention features a microwave plasma generator for producing an axisymmetric plasma which has a waveguide apparatus, means for introducing a microwave source into the waveguide apparatus, and means for generating a circular axisymmetric microwave field from the source. This means for generating may generate only a single mode circular axisymmetric microwave field. The microwave plasma generator further includes means for tuning the microwave field to match the impedance of a load. There is a vacuum chamber for containing a gas to be ionized to form a plasma, means for introducing the gas into the vacuum chamber, and means for coupling the microwave field to the vacuum chamber to form the plasma.

In a preferred embodiment, the waveguide apparatus, which may be tunable, is used to produce a circular axisymmetric microwave field, which may be a single mode, for plasma production. This waveguide apparatus includes an input waveguide with a rectangular cross section, means for introducing a microwave source into the input waveguide, an output waveguide with a circular cross section, and means for connecting the input waveguide to the output waveguide. The waveguide apparatus further includes a probe assembly, which may be adjustable, for generating the microwave field in the output waveguide from the source and substantially matching the resistive impedance of a plasma load. There is also a plunger assembly, which may be adjustable, disposed in the input waveguide for substantially matching the reactive impedance of the load, and means for coupling the output waveguide to a vacuum chamber containing a gas to be ionized to form a plasma.

In a preferred embodiment, the frequency of the microwave source is between 0.5 and 15 GHz and may be approximately 2.45 GHz. The rectangular input waveguide may be small and long enough to transmit only the fundamental transverse electric mode of the microwave source. This is called the $TE_{10}$ mode.

The adjustable probe assembly may include a repeatably axially adjustable conductive rod passing through an opening in the input waveguide and transversely therethrough and coaxially into the output waveguide. This probe assembly may further include a probe tube communicating with the opening and an annular probe choke inside of and connected to the probe tube having a central opening for allowing the rod to pass therethrough. This rod may pass through the center of the input waveguide or may be positioned off center of the input waveguide. The rod may further include means for indicating the position of the end of the rod in the output waveguide.

The adjustable plunger assembly may include a repeatably axially adjustable waveguide stub with a rectangular cross section disposed coaxially within the input waveguide. This plunger assembly may include means for shorting the stub to the input waveguide, and the assembly may further include means for indicating the position of the end of the stub in the input waveguide. The probe choke and the stub are each preferably approximately one quarter wavelength long. The plunger assembly may alternatively include a repeatably axially adjustable shorting plunger in the input waveguide. This plunger assembly preferably includes means for indicating the position of its end in the waveguide.

The means for tuning the field to match the impedance of the load may include adjustment means for matching the resistive and reactive impedance of a plasma load. This adjustment means may include a repeatably adjustable axisymmetric probe and a repeatably adjustable rectangular shorting plunger choke. Both the probe and choke preferably include means for indicating their position in the waveguide. The microwave field may include a transverse magnetic mode with no angular dependence and an integral number of radial mode nodes. The diameter of the output waveguide may be small enough to transmit only one transverse magnetic mode having no angular dependence and one radial mode node. This diameter may be at least 10 cm and is preferably approximately 12 cm. Further, the length of the output waveguide may be made greater than its diameter.

In a preferred embodiment, the input waveguide is approximately 7.2 cm wide, 3.4 cm high, and 25.5 cm long from its entrance flange to the center of the probe assembly. The length of the output waveguide is preferably approximately 12.8 cm. The conductive rod may extend past the choke into the circular waveguide a distance of approximately an integral multiple of one half of the free-space wavelength of the microwave source. This rod may pass through the center of the input waveguide. The output waveguide may increase in diameter along its length in the direction of the vacuum chamber.

The vacuum chamber preferably includes a substrate for interacting with the plasma. There may also be means for heating or cooling the substrate and means for heating or cooling the vacuum chamber. The pressure of the gas to be ionized in the vacuum chamber is preferably between $10^{-7}$ and $10^3$ Torr. There may also be means for keeping the pressure and mixture of this gas relatively constant.

The field which is coupled to the vacuum chamber preferably includes a transverse magnetic mode with no angular dependence and an integral number of radial mode nodes. The plasma generator may also include at least one magnet assembly disposed around the vacuum chamber and may further include means for generating an electric field in the vacuum chamber to accelerate the plasma. The tunable microwave waveguide apparatus may have a combined length of the output waveguide and the vacuum chamber of approximately an integral multiple of one half of the wavelength of the circular guide microwave field.

In an alternative preferred embodiment the microwave plasma generator for producing an axisymmetric plasma includes a repeatably tunable waveguide apparatus having an input tube with a rectangular cross section and a discharge tube with a circular cross section, means for introducing microwave energy into the input tube, and means for coupling an axisymmetric microwave field to the discharge tube. This plasma generator also includes a vacuum chamber for containing a gas to be ionized, means for introducing the gas into the vacuum chamber, and means for connecting the discharge tube to the vacuum chamber. The means for coupling preferably includes means for generating only a single mode axisymmetric microwave field.

DISCLOSURE OF PREFERRED EMBODIMENTS

Other objects, features and advantages will occur from the following description of preferred embodiments and the accompanying drawings, in which.

A microwave plasma generator according to this invention may be accomplished using a waveguide apparatus which preferably is tunable for supplying an axisymmetric microwave field to a vacuum chamber containing a gas to be ionized to form a plasma. The device is especially useful for generating a microwave field with a single mode which may be a transverse magnetic mode microwave field with no angular dependence and a single radial mode node. This microwave field produces an axisymmetric plasma which results in uniform etching, doping, or deposition on a substrate, and is especially useful for semiconductor processing and deposition of hard protective coatings, such as diamond or diamond-like coatings.

The microwave plasma generator includes means for introducing a microwave source into the waveguide and means for generating a circular axisymmetric microwave field, which may be a single mode, from the microwave source. In addition, there are preferably means for tuning the field to match the impedance of a load and means for coupling the microwavefield to a vacuum chamber which contains a gas to be ionized to form a plasma. The vacuum chamber includes means for introducing the gas into the chamber.

The pressure of the gas to be ionized in the vacuum chamber is typically between $10^{-7}$ and $10^3$ Torr. The gas includes atoms which are useful for etching and/or doping a substrate, and/or for being deposited on a substrate to form a coating layer. The vacuum chamber also typically includes a substrate for interacting with the plasma and may include means for heating or cooling the substrate and for heating or cooling the vacuum chamber. The vacuum chamber also preferably includes means for keeping the pressure of the gas in the chamber at a relatively constant level.

The waveguide apparatus typically includes means for tuning the circular microwave field to match the impedance of the plasma load. Typically, this includes adjustment means for matching both the resistive and reactive impedance of the plasma load. This adjustment means preferably includes a repeatably adjustable axisymmetric probe and a repeatably adjustable rectangular shorting plunger choke. Both the probe and the choke may include means for indicating their position in the waveguide so that these positions may be noted to make the impedance matching truly repeatable for different process conditions.

To create a useful plasma density at low pressures, for example from $10^{-7}$ to $10^{-2}$ Torr, at least one permanent or electro-magnet disposed around the outside of the vacuum chamber may be added. These magnets form a magnetic field which is resonant with the electrons and the electric field and increases the energy of the free electrons. Where a high ion impinging velocity is required, the chamber may include means for generating an electric field to accelerate the plasma ions.

Typically, the frequency of the microwave source is between 0.5 and 15 GHz, and is preferably approximately 2.45 GHz.

The microwave waveguide apparatus for producing a circular axisymmetric microwave field, which may be a single mode, for axisymmetric plasma production typically includes a rectangular input waveguide connected to a circular output waveguide. There are means for introducing a microwave source into the rectangular waveguide and means for coupling the circular waveguide to a vacuum chamber which contains the gas to be ionized. Impedance matching is performed by a probe assembly, which may be adjustable, which generates the microwave field in the circular guide and substantially matches the resistive impedance of the plasma and a plunger assembly, which may be adjustable, inside of the rectangular waveguide which substantially matches the reactive impedance of the load. These two degrees of freedom can be adjusted to match the impedance of virtually any plasma load.

The probe assembly typically includes a probe tube, which may be rectangular, communicating with an opening in the rectangular waveguide. This tube has an annular probe choke inside of it and connected to its walls. The choke has a central opening for allowing a conductive rod to pass therethrough. The annular choke is typically approximately one-quarter free-space wavelength long and shorted at a current maximum point. The conductive rod passes through the choke, transversely through the rectangular waveguide, and coaxially into the circular waveguide. To couple a maximum amount of power, the rod passes through the center of the rectangular waveguide. By putting the probe off center, less power is coupled and impedance matching can also be performed. The adjustable rod typically extends past the end of the choke a distance which is approximately an integral multiple of one-half of the free-space wavelength of the microwave source.

This creates a current minimum at the rod/choke interface, which keeps arcing and heating to minimum and eliminates rod jamming and welding. The adjustment means for the rod preferably includes means for indicating the position of the end of the rod in the circular waveguide. This allows easy tuning of the waveguide to repeatably match the impedance of different plasma loads.

The plunger assembly typically includes a rectangular, adjustable waveguide stub which is disposed coaxially within the rectangular waveguide. This stub is typically approximately one-quarter input waveguide wavelength long and is shorted to the rectangular waveguide at an end which corresponds to a low current point. This plunger assembly also preferably includes means for indicating the position of the stub in the rectangular waveguide to repeatably match the impedance of the plasma load. The plunger assembly may alternatively include a shorting plunger disposed in the rectangular waveguide. This embodiment typically includes means for indicating the position of the end of the plunger in the waveguide.

Preferably, the microwave source has a frequency of approximately 2.45 GHz and a power of 50–2000 watts. The input waveguide is preferably small and long enough to transmit only the fundamental transverse electric mode of this source. This allows accurate power measurement. The microwave field coupled to the circular waveguide is typically a transverse magnetic mode with no angular dependence and an integral number of radial mode nodes. Preferably, it has one radial mode node. The diameter of the circular guide may be small enough to transmit only one transverse magnetic mode having no angular dependence and one radial mode node. This diameter can be increased to transmit transverse magnetic modes with more than one radial mode node, or can be decreased to transmit only a transverse magnetic mode with no radial mode nodes. This may be accomplished by providing a larger or smaller diameter output waveguide or by increasing the diameter of the output waveguide along its length in the direction of the vacuum chamber or increasing the diameter in a single step.

The circular output waveguide typically has a length which is greater than its diameter. This length may be approximately 12.8 centimeters. The diameter of the circular waveguide is typically at least 10 centimeters and may be approximately 12 centimeters.

The rectangular input waveguide is typically approximately 7.2 centimeters wide, 3.4 centimeters high, and 25.5 centimeters long from the entrance flange to the center of the coupling probe assembly.

For processing a plasma which does not absorb all of the incident microwave energy in one pass, the length of the output waveguide and the vacuum chamber attached to the waveguide may be held at approximately an integral multiple of one-half of the wavelength of the circular guide microwave field. This forms a cavity in which the microwave is resonant, and can create a high-intensity wave from a relatively low power microwave source. If the plasma is opaque, the length of the output waveguide and the vacuum chamber up to the plasma may be held at approximately an integral multiple of one-half of the wavelength of the circular guide microwave field. For plasmas which absorb in one pass, this length is not critical.

Figure 1A:
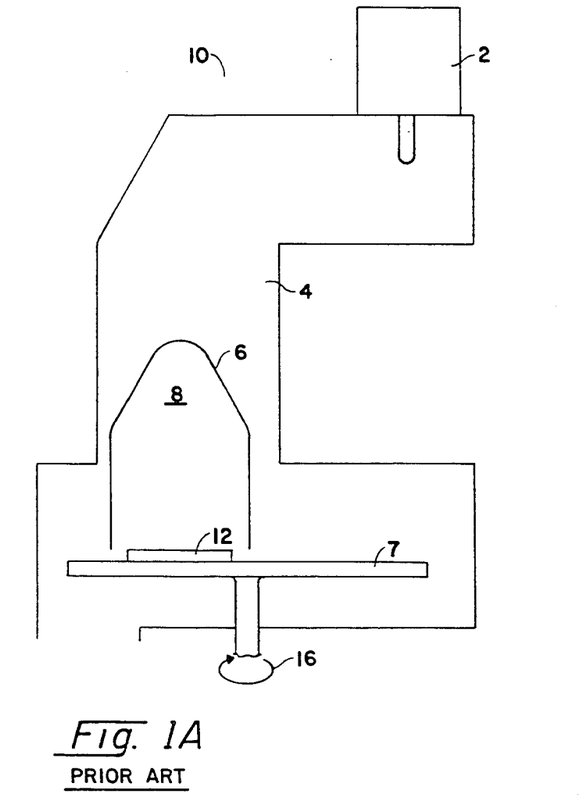
FIG. 1A is a diagrammatic cross-sectional view of a prior art microwave plasma generator.

There is shown in FIG. 1A a prior art microwave plasma generator 10. Microwaves are generated by microwave oscillator 2. Waveguide 4 introduces these microwaves into discharge chamber 6. Chamber 6 contains a gas to be ionized in its interior 8. The bottom of chamber 6 is shaped to confine the plasma into a sectoral shape 15, FIG. 1B. The plasma impinges on substrate 12, which is transported in a circular path, indicated by arrow 16, by turntable 7.

Figure 1B:
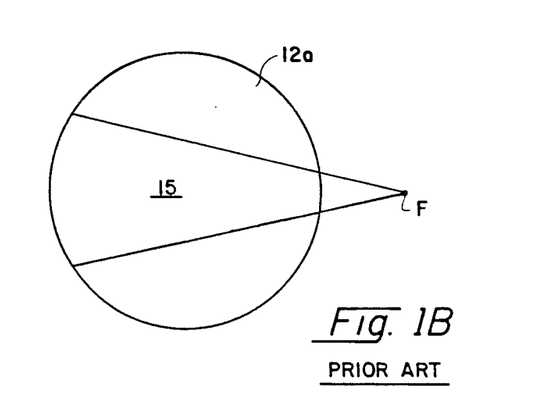
FIG. 1B is a top plan view of the substrate of FIG. 1A.

As is more clearly shown in FIG. 1B, substrate 12a passes through fan-shaped plasma exposure region 15. Region focal point F coincides with the center of turntable 7. Accordingly, when substrate 12a revolves in a circular path around point F, each point on substrate 12a is exposed to the plasma for the same amount of time. Thus, this system allows relatively uniform substrate processing with a non-axisymmetric microwave field and plasma.

Figure 2:
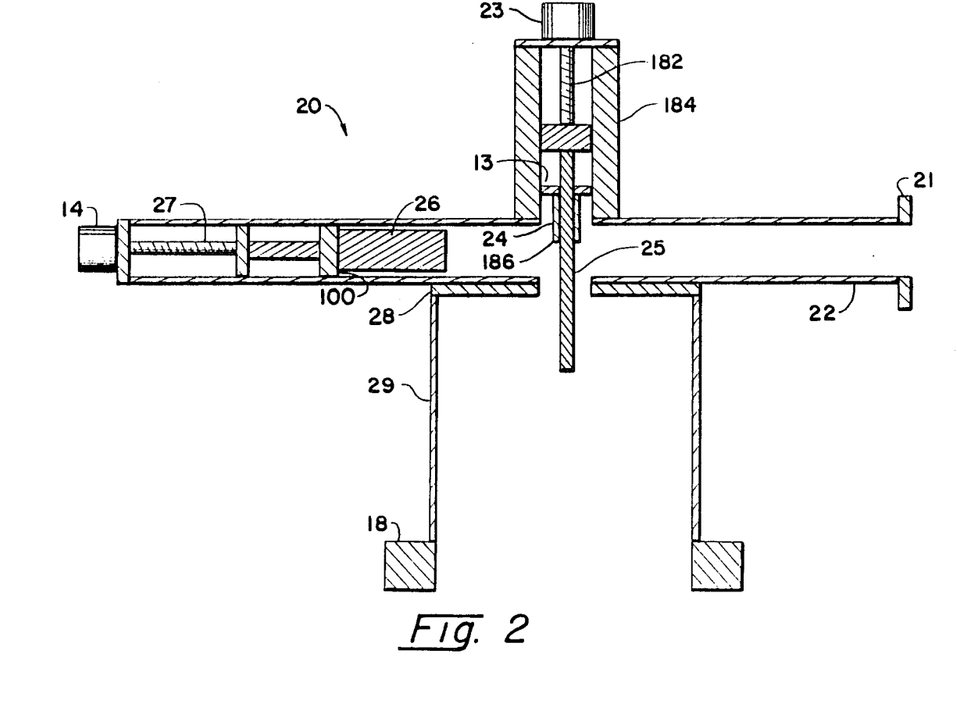
FIG. 2 is a diagrammatic cross-sectional view of a microwave guide according to the present invention.

A waveguide apparatus for axisymmetric microwave field production is shown in FIG. 2. Waveguide apparatus 20 includes rectangular input waveguide 22 with flange 21 for mating with a microwave source generator, not shown. A conductive rod 25 passes transversely through input waveguide 22 and coaxially into circular output waveguide 29. Waveguide 29 has a circular flange 28 and mating flange 18 for mating with a vacuum chamber, not shown. Rod 25 is attached to worm drive mechanism 182, which is driven by repeatable indicating knob 23. Knob 23 may be turned in a counterclockwise direction to move rod 25 farther into waveguide 29. Knob 23 is moved in a clockwise direction to retract rod 25. Knob 23 includes indicating means, not shown, for indicating the depth of protrusion of rod 25 into waveguide 29. Annular probe choke 24 is centrally disposed in rectangular tube 184, and includes washer 13 connected to tube 184 which shorts the choke at a current maximum point. Choke 24 is typically one-quarter of a free-space wavelength long and its end 186 is located at a current minimum. By locating this point 186 at a current minimum, arcing and heat generation are minimized. This decreases the possibility of spot welding or probe jamming, and results in smooth operation of worm drive 182.

Rod 25 couples only axisymmetric mode microwaves to waveguide 29. By adjusting the probe up or down, the resistive impedance of the plasma load can be substantially matched. Thus, the guide can be used to couple axisymmetric mode microwave fields for plasma production and can be repeatably set to match the resistive impedance of a variety of plasma loads.

Rectangular waveguide 22 also includes repeatably axially adjustable waveguide stub 26 which has a rectangular cross section and is slightly smaller than input waveguide 22 so it does not touch the sides. Slug 100 is attached to stub 26 and shorts the stub to the wall of the waveguide at a current minimum. Stub 26 is axially adjustable by means of worm drive 27 driven by repeatably indicating knob 14 in the same manner as worm drive 182 and knob 23 described above. Stub 26 can be axially adjusted to reflect a wave which cancels the reactive wave component left over from internal reflections. By brazing conducting joints, locating all moving joints at low current points, and not including any insulating parts, waveguide apparatus 20 is able to handle high power continuous wave operation with low power loss and still remain smoothly and repeatably adjustable.

As a result, waveguide apparatus 20 can be adjusted to couple only the desired axisymmetric mode microwave field to a plasma load, not shown, and is tunable to cancel internally reflected waves and match the impedance of substantially any plasma load connected to it. Tuning of waveguide apparatus 20 is important because a properly tuned waveguide delivers the maximum available microwave energy to the vacuum chamber for plasma production. An incorrectly tuned waveguide causes power loss through loss of uncancelled internally reflected waves out of the waveguide through flange 21.

A waveguide apparatus for coupling a $TM_{01}$ mode, generated from a $TE_{10}$ mode, may be made by providing an input waveguide 22 which is approximately 7.2 cm wide, 3.4 cm high, and 25.5 cm long from its entrance flange 21 to the center of probe tube 184. Output waveguide 29 has a diameter of at least 10 cm, and is preferably approximately 12 cm. The length of the output waveguide from flange 28 to flange 18 is approximately 12.8 cm.

Figure 3:
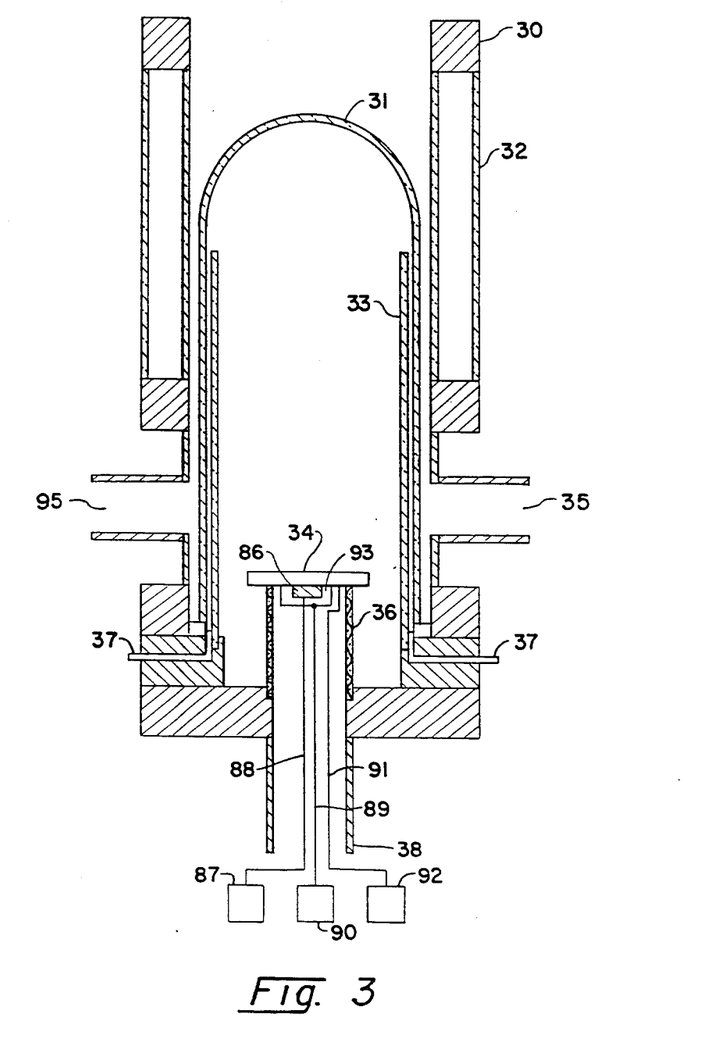
FIG. 3 is a diagrammatic cross-sectional view of a vacuum chamber for plasma generation according to the present invention.

A vacuum chamber for use with the waveguide is shown in FIG. 3. Bell jar 31 is centrally located in circular vacuum chamber and waveguide 190. Chamber 190 is mated to the microwave guide, not shown, by flange 30. Single or double screen 32 is provided for viewing the interior of bell jar 31, exhausting cooling air, and preventing microwave leakage. There is also a protective ultraviolet shield, not shown, outside of screen 32 to prevent eye damage. Substrate 34 is located near the end of chamber 190, and may be heated by heater 86 supplied with power from power source 87 through wires 88. Substrate 34 may also be cooled by cooling block 93 supplied with water from water source 90 through pipes 89. This heating and cooling allows operation over a wide range of substrate operating temperatures. Substrate temperature is monitored by temperature indicator 92, which includes temperature probe 91. Perforated flange 36 allows evacuation of bell jar 31.

Once the chamber has been evacuated through perforated flange 36, gas is introduced through radially located pipes 37, which are connected to a gas pressure source and manifold, not shown. Gas enters through pipes 37 and is dispersed by baffle 33 so it flows axially uniformly into the top of bell jar 31. A blower, not shown, is provided to force air or other cooling gas through pipes 35 and 95 and around bell jar 31 and out through screen 32. This air flow cools bell jar 31. The blower may also blow hot air to heat bell jar 31.

Figure 4:
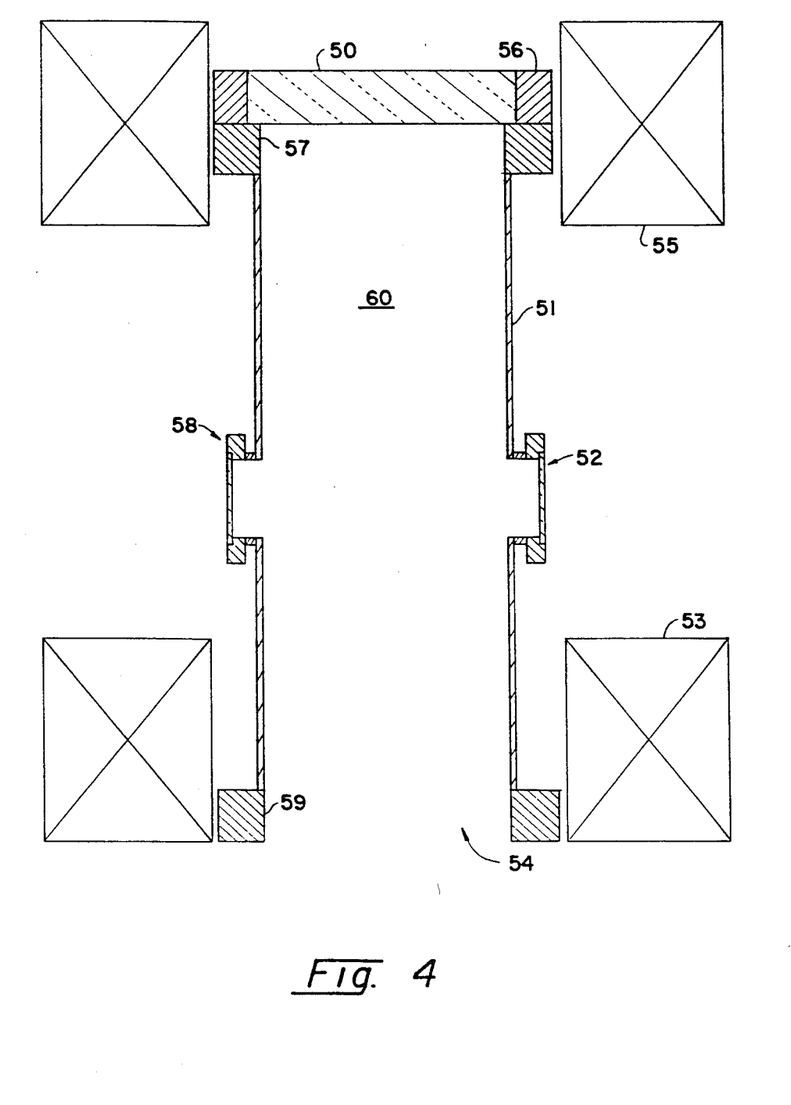
FIG. 4 is a diagram of an alternative vacuum chamber for microwave plasma generation according to the present invention.

An alternative vacuum chamber is shown in FIG. 4. Here, flange 56 is provided to meet with a flange, not shown, of the circular output waveguide of the axisymmetric waveguide apparatus. Vacuum window 50 preferably has a thickness of approximately one quarter wavelength. Flange 56 is preferably located at a field minimum. Therefore, a field maximum will be located at or just inside of the underside of window 50. Flange 57 is provided to mate with flange 56 to hold the window tightly in place. Viewing ports 52 and 58 are provided to allow visual and electronic inspection of the plasma process. Flange 59, at the far end of vacuum chamber 60, is sized to mate with a flange, not shown, which leads to a cavity which holds the substrate and provides a means for evacuating chamber 60.

In operation, chamber 60 is evacuated and the gas to be ionized is introduced by a means, not shown. Microwaves entering through window 50 generate a plasma in cavity 60. Annular magnets 55 and 53 create a magnetic field which is essentially parallel to the walls 51 of chamber 60. Magnet 55 also creates an Electron Cyclotron Resonance (ECR) and thereby increases electron energy and aids in plasma production at low pressures of, for example, between $10^{-2}$ to $10^{-7}$ Torr. Positively charged plasma ions then travel along magnetic field lines toward flange 59 and pass through opening 54 to impinge on the substrate, not shown.

Figure 5:
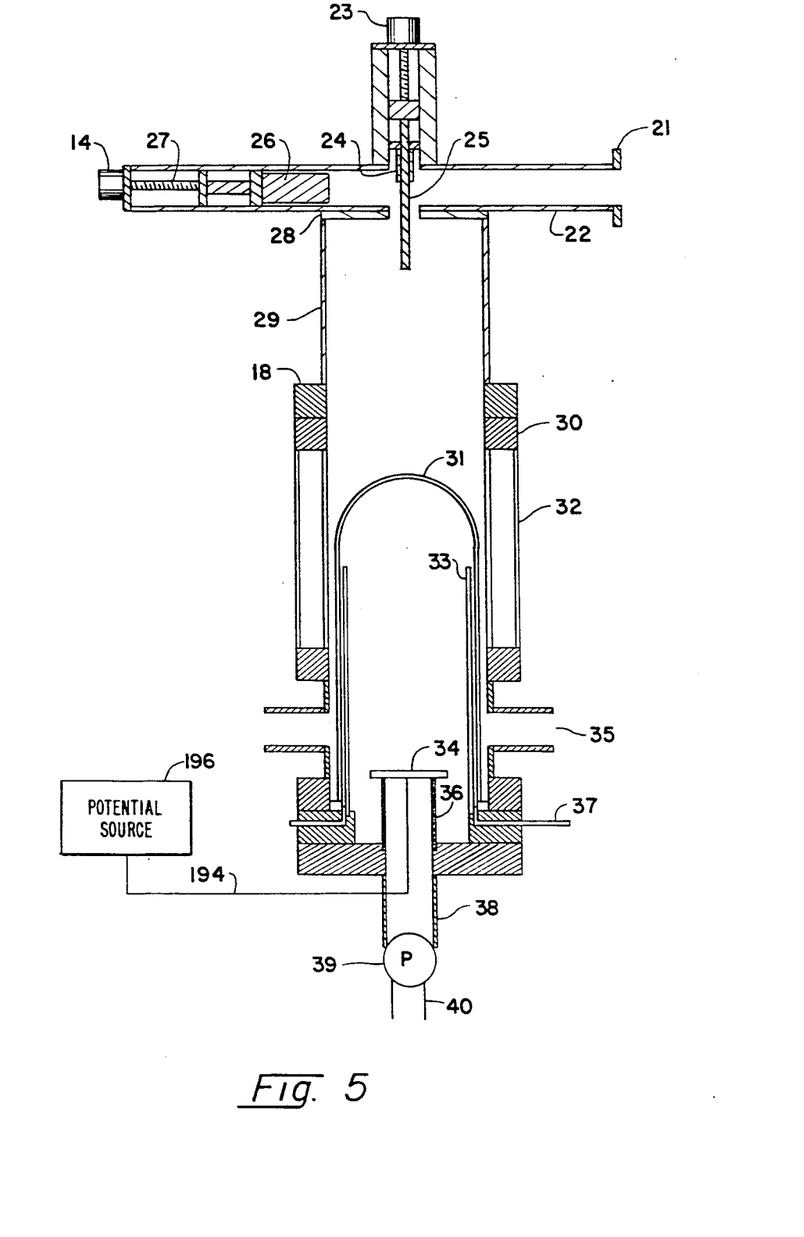
FIG. 5 is a diagrammatic cross-sectional view of a microwave plasma generator according to the present invention.

A typical microwave plasma generator is shown completely assembled in FIG. 5. Rod 25 couples an axisymmetric mode microwave to circular guide 29. Gas to be ionized is introduced into bell jar 31 through pipe 37 supplied by a gas pressure source, not shown. The microwave field creates an axisymmetric plasma inside of bell jar 31. This plasma moves all through bell jar 31 and generally toward substrate 34. Pump 39 exhausts chamber 31 through flange 36 and pipe 40. Plasma ions may be accelerated by supplying a DC or RF electric potential to the substrate. Substrate 34 may be connected to a potential source 196 through wire 194. By providing a negative potential of, for instance, negative 100V, ions impinging on substrate 34 will be accelerated to an energy of approximately 100 eV. The generator can also be used as an ion gun for a high energy accelerator.

Figure 6:
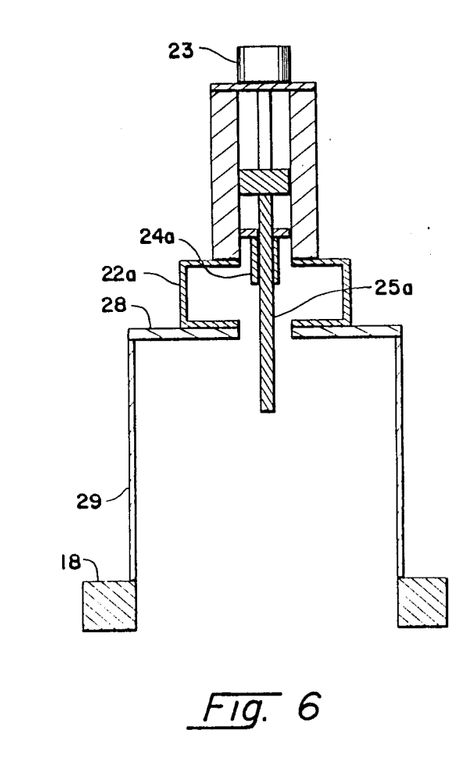
FIG. 6 is a diagrammatic cross-sectional end view of a microwave coupling probe of the present invention.

A centrally disposed adjustable probe for coupling a maximum power axisymmetric microwave field is shown in FIG. 6. Repeatably axially adjustable conductive rod 25a passes centrally through rectangular input waveguide 22a and coaxially into circular ouput waveguide 29. Waveguide 22a is made long enough to propagate only the $TE_{10}$ mode. Therefore, centrally disposed rod 25a is at a high electric field energy point and thus couples the maximum amount of power to output guide 29.

Figure 7:
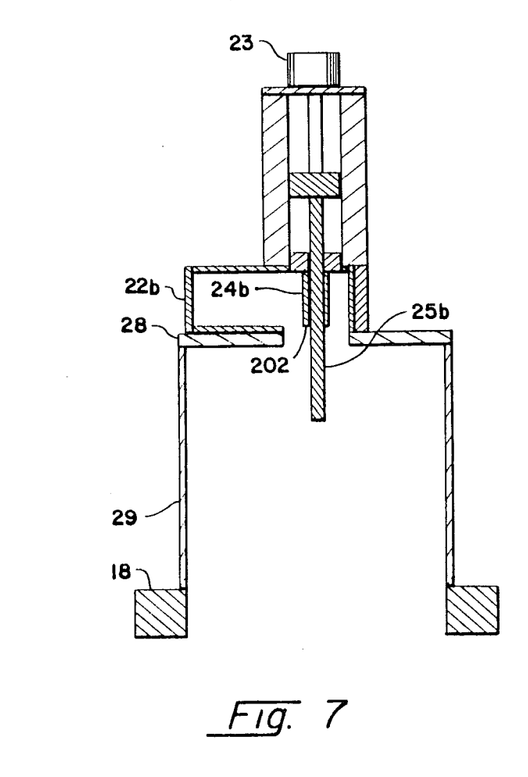
FIG. 7 is a diagrammatic cross-sectional end view of an alternative microwave coupling probe of the present invention.

Coupled power can be reduced as shown in FIG. 7. Conductive rod 25b may be located off center of rectangular input waveguide 22b. Thus, rod 25b is not located at the highest electric field energy point and therefore couples less energy to output waveguide 29. In this embodiment, choke 24b ends at point 202, which is chosen to be a current minimum point. In each of the embodiments, conductive rod 25 preferably extends beyond the end of choke 24 a distance of approximately an integral multiple of one-half of the microwave free-space wavelength to make the rod approximately resonant. By making rod 25 axially adjustable, the length of protrusion can be changed to substantially match the resistive impedance of the plasma load.

Figures 8, 9A:
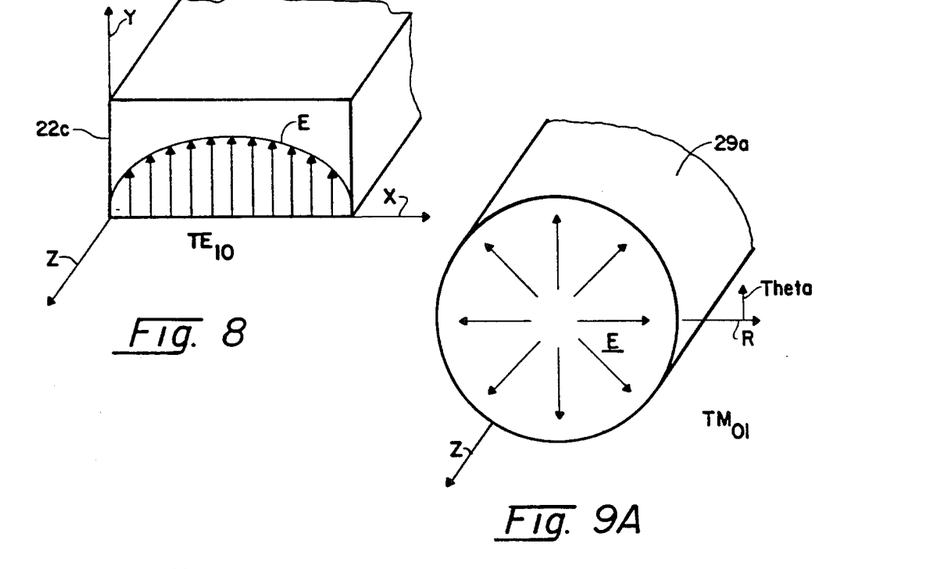
FIG. 8 is a schematic diagram of the fundamental transverse electric microwave mode in a rectangular guide.
FIG. 9A is a schematic diagram of a transverse magnetic microwave mode with no angular dependence and a single radial mode node in a circular guide.

The desired $TE_{10}$ input mode is schematically depicted in FIG. 8. Rectangular waveguide 22c is shown in cross section, and Cartesian axes x, y, and z are superimposed on this cross section. The $TE_{10}$ electric field E is indicated by the arrows. It can be seen that there is one degree of x dependence and zero dependence in the y direction.

Figures 9B, 9C:
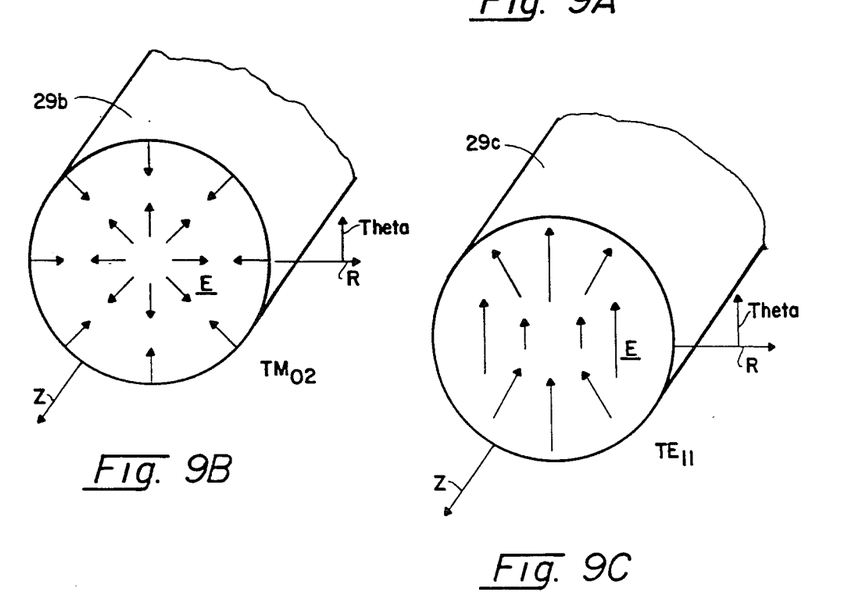
FIG. 9B is a schematic diagram of a transverse magnetic microwave mode with no angular dependence and two radial mode nodes in a circular guide.
FIG. 9C is a schematic diagram of a transverse electric microwave mode with a single variation in the theta direction and a single radial variation in a circular guide.

Several forms of waves in a circular waveguide are shown in FIGS. 9A through 9C. FIG. 9A shows a desired transverse magnetic mode with no angular dependence and one radial mode node. Axes Z, R and Theta are superimposed for reference, Z being parallel to the direction of propagation, R being a radius of the circular waveguide, and Theta the angular axis. This mode is called the $TM_{01}$ mode. The $TM_{02}$ mode is shown in FIG. 9B. Here, electric field E has two radial mode nodes but still no angular dependence.

An undesirable $TE_{11}$ mode is shown in FIG. 9C. Here, electric field E, which has a single angular variation and a single radial variation, is shown. This mode is nonaxisymmetric and, if coupled to circular guide 29c, would result in non-axisymmetric plasma production and non-uniform substrate processing.

Figure 10A:
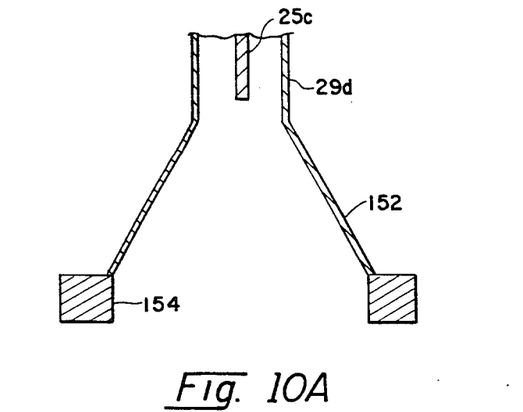
FIG. 10A is a diagrammatic cross-sectional view of an alternative circular output waveguide according to the present invention.

Alternative circular output waveguide 29d, FIG. 10A, includes flared circular waveguide portion 152 which has flange 154 for mating with a flange, not shown, on a large vacuum chamber. Axisymmetric waves generated by conductive rod 25c propagate down circular guide 29d and enter waveguide portion 152, which has an increasingly larger diameter. This increased diameter waveguide propagates the same mode as generated, but increases the size of the field. This flared design can be used to create large, axisymmetric plasmas for processing large or multiple substrates.

Figure 10B:
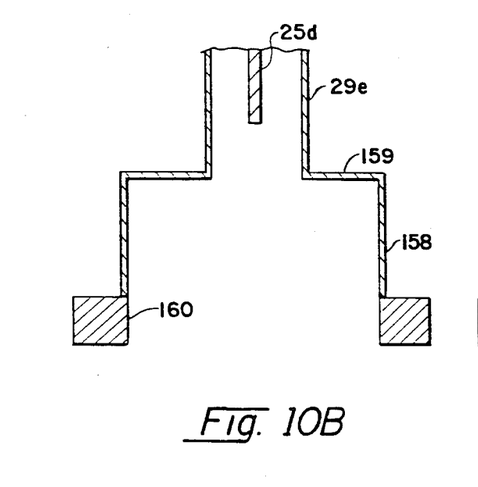
FIG. 10B is a diagrammatic cross-sectional view of another alternative circular output waveguide according to the present invention.

FIG. 10B shows an alternative way of increasing the size of the microwave field. Rod 25d generates an axisymmetric mode microwave field, for example a $TM_{01}$ field, in circular waveguide 29e. Annular connecting portion 159 connects larger diameter circular waveguide 158 to waveguide 29e. Guide 158 ends in flange 160, which mates with the vacuum chamber, not shown. This stepped increase in diameter propagates an axisymmetric mode microwave field with more radial mode nodes than the field generated by rod 25d, for example a $TM_{02}$ or $TM_{03}$ field. These larger fields can be used to generate large, axisymmetric plasmas for processing large or multiple substrates.

Figure 10C:
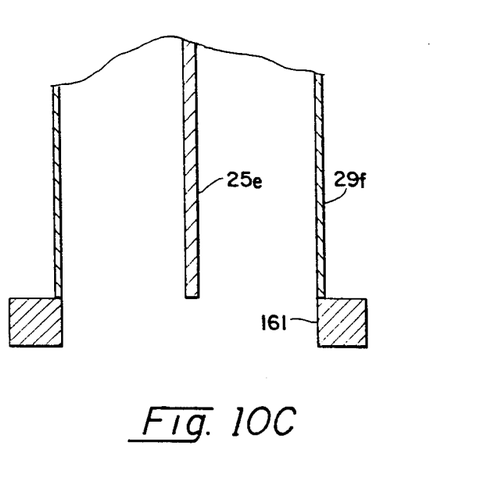
FIG. 10C is a diagrammatic cross-sectional view of a circular output waveguide with a very small diameter.

A cutoff electric field output waveguide is shown in FIG. 10C. Here, waveguide section 29f has a relatively small diameter and ends in flange 161, which meets with vacuum chamber flange or vacuum pump, not shown. In this embodiment, the substrate, not shown, is typically placed downstream of the end of rod 25e a distance of less than the diameter of circular waveguide section 29f. If the substrate is placed more than this distance from this point, the wave will be too small to be useful for plasma production.

Figure 11:
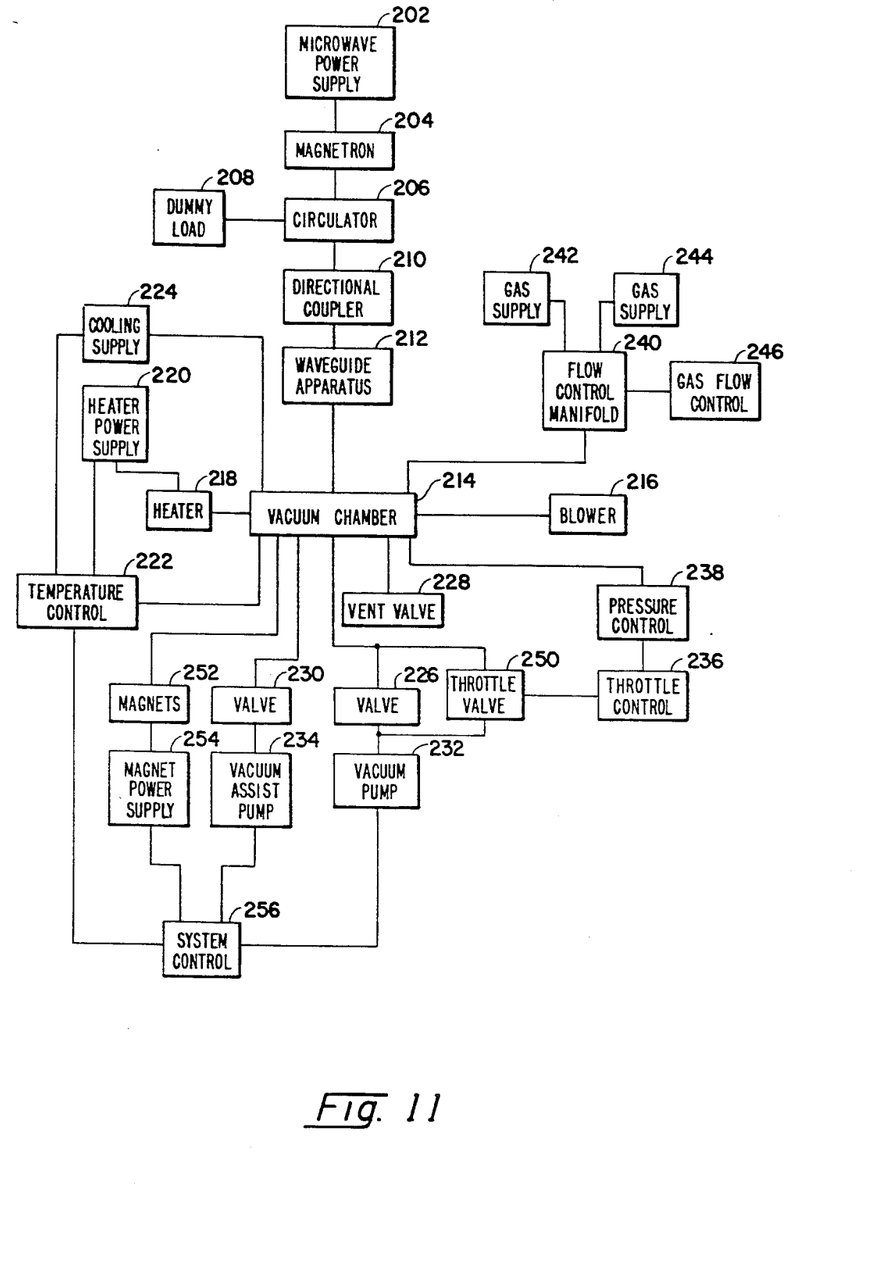
FIG. 11 is a block diagram of a microwave plasma generator according to the present invention.

The microwave plasma generator is shown in block diagram in FIG. 11. Microwave power supply 202 drives magnetron 204 with DC power. Circulator 206 allows forward power to pass, but deflects any reflected power into dummy load 208, which absorbs this reflected power. Circulator 206 thus keeps magnetron 204 from being damaged by any reflected power.

Directional coupler 210 couples the microwave field to waveguide apparatus 212 and also indicates the directions and quantity of power flow. Waveguide apparatus 212 couples an axisymmetric mode microwave field to vacuum chamber 214, and also matches the impedance of the plasma load in chamber 214.

Heater 218 heats the substrate being processed in vacuum chamber 214 to the desired temperature, and is powered by power supply 220. Cooling supply 224 supplies cooling water to the substrate to allow cooler temperature operation. Temperature control 222 includes a sensor for sensing the temperature of the substrate, and controls operation of power supply 220 and cooling supply 224 to alter the temperature of the substrate as required. Blower 216 blows hot or cold air around vacuum chamber 214 to heat or cool the surface of the chamber. Blower 216 can also circulate a cooling fluid around chamber 214 if greater cooling efficiency is required.

Vacuum pump 232, in conjunction with valve 226, is used to evacuate chamber 214. Gas flow from gas supply 242 and 244 is controlled and mixed by flow control manifold 240, which supplies the gas or gas mixture to chamber 214. Gas flow control 246 controls operation of manifold 240. The gas can be made up of several gases, and its composition and pressure are controlled by control 246 and manifold 240. Throttle valve 250 is situated in a bypass line, and is used to control the flow of gas out of chamber 214 by varying the flow to vacuum pump 232. Throttle control 236 controls throttle valve 250, and is responsive to pressure control 238, which senses the pressure in chamber 214. These controls allow accurate pressure regulation of gas in chamber 214. Vent valve 228 is used to vent chamber 214 to atmospheric pressure.

When extremely low gas pressures are required, for example $10^{-2}$ to $10^{-7}$ torr, vacuum assist pump 234 and valve 230 are employed. Magnets 252, which may be permanent or partially permanent or electro-magnets, are disposed around vacuum chamber 214. Power supply 254 energizes the electro-magnets. Magnets 252 help form the plasma at these low pressures, and also help guide it toward the substrate. System control 256 may be added to automate the complex heating, cooling, vacuum, pressure and magnet controls.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A microwave plasma generator for producing an axisymmetric plasma, comprising:
    a waveguide apparatus;
    means for introducing a microwave source into said waveguide apparatus;
    means for generating a circular axisymmetric microwave field from said source;
    means for tuning said field to match the impedance of a plasma load;
    a vacuum chamber, interconnected to said waveguide apparatus, for containing a gas to be ionized to form said plasma;
    means for introducing said gas into said vacuum chamber; and
    means for coupling said field to said vacuum chamber to form, in response to said circular axisymmetric microwave field, said axisymmetric plasma.

2. The microwave plasma generator of claim 1 in which said means for tuning includes adjustment means for matching the resistive and reactive impedance of a plasma load.

3. The microwave plasma generator of claim 1 in which the pressure of said gas to be ionized in said vacuum chamber is between $10^{-7}$ and $10^3$ Torr.

4. The microwave plasma generator of claim 1 in which said vacuum chamber includes a substrate for interacting with said plasma.

5. The microwave plasma generator of claim 4 further including means for heating said substrate.

6. The microwave plasma generator of claim 4 further including means for cooling said substrate.

7. The microwave plasma generator of claim 1 further including means for heating said vacuum chamber.

8. The microwave plasma generator of claim 1 further including means for cooling said vacuum chamber.

9. The microwave plasma generator of claim 3 further including means for keeping the pressure of said gas relatively constant.

10. The microwave plasma generator of claim 1 in which said field includes a transverse magnetic mode with no angular dependence and an integral number of radial mode nodes.

11. The microwave plasma generator of claim 2 in which said adjustment means includes a repeatably adjustable probe and a repeatably adjustable rectangular shorting plunger choke.

12. The microwave plasma generator of claim 11 in which said probe includes means for indicating the position of said probe in said waveguide.

13. The microwave plasma generator of claim 11 in which said choke includes means for indicating the position of said choke in said waveguide.

14. The microwave plasma generator of claim 1 further including at least one magnet assembly disposed around said vacuum chamber.

15. The microwave plasma generator of claim 1 in which the frequency of said microwave source is between 0.5 and 15 GHz.

16. The microwave plasma generator of claim 1 in which the frequency of said microwave source is approximately 2.45 GHz.

17. The microwave plasma generator of claim 1 further including means for generating an electric field in said vacuum chamber to accelerate said plasma.

18. A tunable microwave waveguide apparatus for producing a single mode circular axisymmetric microwave field for axisymmetric plasma production, comprising:
    an input waveguide with a rectangular cross section;
    means for introducing a microwave source into said input waveguide;
    an output waveguide with a circular cross section;
    means for connecting said input waveguide to said output waveguide;
    an adjustable probe assembly for generating said microwave field in said output waveguide from said source and substantially matching the resistive impedance of a plasma load;
    an adjustable plunger assembly disposed in said input waveguide for substantially matching the reactive impedance of said load; and
    means for coaxially coupling said output waveguide to a vacuum chamber containing a gas to be ionized to form said axisymmetric plasma.

19. The tunable microwave waveguide apparatus of claim 18 in which said probe assembly includes a repeatably axially adjustable conductive rod passing through an opening in said input waveguide and transversely therethrough and coaxially into said output waveguide.

20. The tunable microwave waveguide apparatus of claim 19 in which said probe assembly includes a probe tube communicating with said opening and an annular probe choke inside of and connected to said probe tube having a central opening for allowing said rod to pass therethrough.

21. The tunable microwave waveguide apparatus of claim 20 in which said rod passes through the center of said input waveguide.

22. The tunable microwave waveguide apparatus of claim 20 in which said rod passes through said input waveguide at an off-center position.

23. The tunable microwave waveguide apparatus of claim 20 in which said rod includes means for indicating the position of the end of said rod in said output waveguide.

24. The tunable microwave waveguide apparatus of claim 18 in which said plunger includes a repeatably axially adjustable waveguide stub with a rectangular cross section disposed coaxially within said input waveguide.

25. The tunable microwave waveguide apparatus of claim 24 in which said plunger assembly includes means for shorting said stub to said input waveguide.

26. The tunable microwave waveguide apparatus of claim 25 in which said plunger assembly includes means for indicating the position of the end of said stub in said input waveguide.

27. The tunable microwave waveguide apparatus of claim 18 in which said plunger assembly includes a repeatably axially adjustable shorting plunger disposed in said input waveguide.

28. The tunable microwave waveguide apparatus of claim 27 in which said plunger assembly includes means for indicating the position of the end of said plunger in said input waveguide.

29. The tunable microwave waveguide apparatus of claim 20 in which said probe choke is approximately one quarter free-space wavelength long.

30. The tunable microwave waveguide apparatus of claim 24 in which said stub is approximately one quarter input waveguide wavelength long.

31. The tunable microwave waveguide apparatus of claim 18 in which the frequency of said source is approximately 2.45 GHz.

32. The tunable microwave waveguide apparatus of claim 18 in which said input waveguide is small and long enough to transmit only the fundamental transverse electric mode of said source.

33. The tunable microwave waveguide apparatus of claim 18 in which the diameter of said output waveguide is small enough to transmit only one transverse magnetic mode having no angular dependence and one radial mode node.

34. The tunable microwave waveguide apparatus of claim 18 in which the length of said output waveguide is greater than its diameter.

35. The tunable microwave waveguide apparatus of claim 18 in which said field includes a transverse magnetic mode with no angular dependence and an integral number of radial mode nodes.

36. The tunable microwave waveguide apparatus of claim 33 in which the diameter of said output waveguide is approximately 12 cm.

37. The tunable microwave waveguide apparatus of claim 34 in which the length of said output waveguide is approximately 12.8 cm.

38. The tunable microwave waveguide apparatus of claim 18 in which said input waveguide is approximately 7.2 cm. wide, 3.4 cm. high, and 25.5 cm. long from its entrance flange to the center of said probe assembly.

39. The tunable microwave waveguide apparatus of claim 18 in which the diameter of said output waveguide is at least 10 cm.

40. The tunable microwave waveguide apparatus of claim 20 in which said rod extends past said choke a distance of approximately an integral multiple of one half of the free-space wavelength of said microwave source.

41. The tunable microwave waveguide apparatus of claim 18 in which the combined length of said output waveguide and said vacuum chamber is approximately an integral multiple of one-half of the wavelength of said microwave field.

42. The tunable microwave waveguide apparatus of claim 20 in which said rod passes through the center of said input waveguide.

43. The tunable microwave waveguide apparatus of claim 18 in which the diameter of said output waveguide increases along its length in the direction of said vacuum chamber.

44. A microwave plasma generator for producing an axisymmetric plasma, comprising:
   a repeatably tunable waveguide apparatus having an input tube with a rectangular cross section and a discharge tube with a circular cross section;
   means for introducing microwave energy into said input tube;
   means for coupling an axisymmetric microwave field to said discharge tube;
   a vacuum chamber for containing a gas to be ionized;
   means for introducing said gas into said vacuum chamber; and
   means for coaxially connecting said discharge tube to said vacuum chamber for producing said axisymmetric plasma in response to said axisymmetric microwave field.

45. The microwave plasma generator of claim 44 in which said means for coupling includes means for generating only a single mode axisymmetric microwave field.

46. A microwave plasma generator for producing an axisymmetric plasma, comprising:
   a waveguide apparatus;
   means for introducing a microwave source into said waveguide apparatus;
   means for generating only a single mode circular axisymmetric microwave field from said source;
   means for tuning said field to match the impedance of a load;
   a vacuum chamber for containing a gas to be ionized;
   means for introducing said gas into said vacuum chamber; and
   means for coaxially coupling said field to said vacuum chamber to form said axisymmetric plasma from said gas in response to said circular axisymmetric microwave field.

47. A microwave waveguide apparatus for producing a circular axisymmetric microwave field for axisymmetric plasma production, comprising:
   an input waveguide with a rectangular cross section;
   means for introducing a microwave source into said input waveguide;
   an output waveguide with a circular cross section;
   means for connecting said input waveguide to said output waveguide;
   a probe assembly for generating said circular axisymmetric microwave field in said output waveguide from said source and substantially matching the resistive impedance of a plasma load;
   a plunger assembly disposed in said input waveguide for substantially matching the reactive impedance of said load; and
   means for coaxially coupling said output waveguide to a vacuum chamber containing a gas to be ionized to form said axisymmetric plasma in response to said circular axisymmetric microwave field.

* * * * *